(12) United States Patent
Huang

(10) Patent No.: US 8,371,721 B2
(45) Date of Patent: Feb. 12, 2013

(54) LIGHT EMITTING DIODE ELEMENT AND LIGHT THEREOF

(75) Inventor: Kuo-Hao Huang, He Cheng Town (CN)

(73) Assignee: Heshan Jian Hao Lighting Ind. Co., Ltd., He Cheng Town, Guang Dong Province (CN)

(*) Notice: Subject to any disclaimer, the term of this patent is extended or adjusted under 35 U.S.C. 154(b) by 546 days.

(21) Appl. No.: 12/628,683

(22) Filed: Dec. 1, 2009

(65) Prior Publication Data

US 2011/0128744 A1    Jun. 2, 2011

(51) Int. Cl.
*F21V 3/00*     (2006.01)
(52) U.S. Cl. ......... 362/311.02; 362/249.02; 362/311.01; 362/545
(58) Field of Classification Search ............ 362/249.02, 362/311.01–311.03, 545, 555, 612, 800; 257/99
See application file for complete search history.

(56) References Cited

U.S. PATENT DOCUMENTS

2009/0146167 A1*   6/2009   Allen et al. ............ 257/98

* cited by examiner

*Primary Examiner* — Meghan Dunwiddie
(74) *Attorney, Agent, or Firm* — Muncy, Geissler, Olds & Lowe, PLLC

(57) ABSTRACT

A LED (light emitting diode) element and a LED light thereof are revealed. The LED element includes a resin base, a LED chip embedded in the resin base and at least two leads formed by an upper part and a lower part. A top end of the upper part is mounted in the resin base and is electrically connected with the LED chip so as to make the LED chip emit light. A bottom end of the upper part extends out of the resin base and connects with a top end of the lower part. The LED element is combined with a light housing to be used. Thereby the lead will not rust easily and break due to bending. This is suitable for outdoor use, environmental protection and energy savings.

6 Claims, 5 Drawing Sheets

LIGHT EMITTING DIODE ELEMENT AND LIGHT THEREOF

BACKGROUND OF THE INVENTION

1. Fields of the Invention

The present invention relates to a LED (light-emitting diode) element and a light thereof, especially to a LED element in which a lead is formed by an upper part and a lower part made of different metals. The lower part is made of metal that is not rusted easily and more soft than the metal of the upper part so that the lower part has better toughness than the upper part. This favors following processing or applications of the LED element.

2. Descriptions of Related Art

LED has advantages of lower power consumption, long life span, no idling time, and quick response speed and features of compact volume, vibration resistance, and suitability for mass production. Thus the LED has been applied to various light sources and gradually has replaced conventional incandescent lamps. Refer to FIG. 1, a LED element is shown. A LED chip 20a is bonded to a top of two leads 30a and then is packaged in a resin base 10a. Thus one end of the lead 30a together with the LED chip 20a is embedded in the resin base 10a. while the other end thereof extends out of the resin base 10a to form an electrical connection part 301a with a certain length. Thus while assembling, the electrical connection part 301a is bent for electrical connection with other electronics. However, the lead 30a of mass-produced LED elements available now generally is made of iron by iron sheet stamping. But the lead 30a made of iron is still with stiffness. That means the toughness of the lead 30a is insufficient and this is disadvantageous in the secondary processing of the electrical connection part 301a such as common used bending processing. The electrical connection part 301a becomes brittle and breaks in the bending. Moreover, the electrical connection part 301a rusts easily. Thus the electrical connection part 301a is easy to have problems of breakage, alignment errors and poor conductivity. And the LED elements or LED lamps are easily damaged. Therefore, the LED elements available now always have problems in the electrical connection part 301a of the lead 30a such as breakage, damages and rust. There is a need to provide a new LED element that overcomes above shortcomings.

SUMMARY OF THE INVENTION

Therefore it is a primary object of the present invention to provide a LED element that includes at least two two-part lead with features of rust protection, easy secondary processing during assembly processes, better toughness for preventing breakage, and precise alignment.

It is another object of the present invention to provide a LED light that is for outdoor use, environmental protection and energy savings.

In order to achieve objects, a LED element of the present invention includes a resin base, a LED chip and at least two leads formed by an upper part and a lower part. The upper part is made of iron sheet by stamping and a stop end thereof is embedded in the resin base and is electrically connected with the LED chip. A bottom end of the upper part extends out of the resin base and connects with a top end of the lower part to form an integrated part. The lower part is made of electrically conductive metal that is not rusted easily and more soft than the metal of the upper part such as copper, aluminum or their alloys. Thus the lower part has better toughness than the upper part. Therefore, the lead is rust-resistant, suitable for secondary processing such as bending without breaking and precise aligned during assembly processes.

The LED element is assembled with a light housing to form a LED light. The light housing is made from transparent or semi-transparent glass or plastic. The shape of the light housing is not limited. It can look like Christmas lights, balls, flame tips or ice creams.

DETAILED DESCRIPTION OF THE PREFERRED EMBODIMENT

Figure 2:
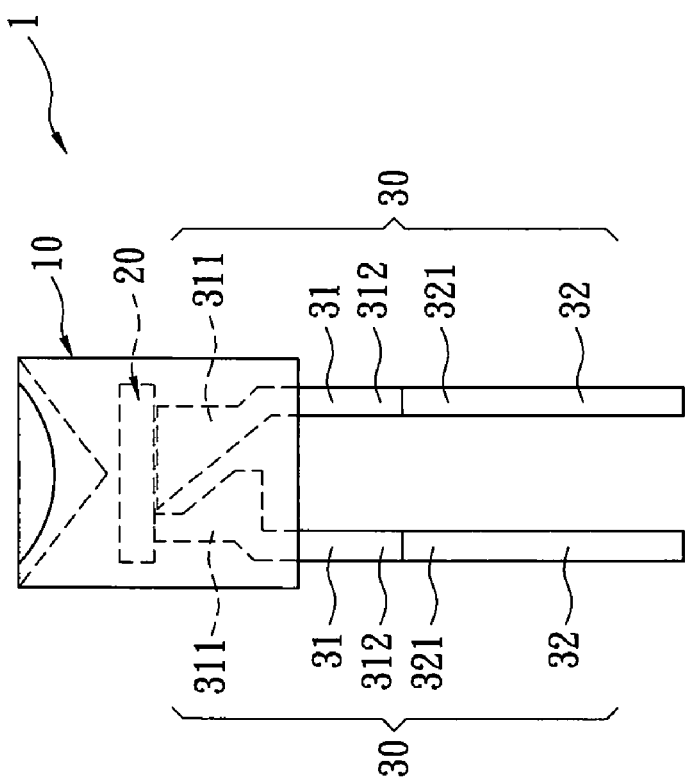
FIG. 2 is a schematic drawing showing structure of an embodiment according to the present invention.

Refer to FIG. 2, a LED element 1 of the present invention consists of a resin base 10, a LED chip 20 and at least two leads 30. The assembling and packaging of these three parts are achieved by techniques available now. The LED chip 20 is bonded to a top of two leads 30 and then the resin base 10a covers the LED chip 20 and leads 30. The resin base 10a is made from thermoplastic resin such as epoxy resin. There is no limit on the electrical connection way between the LED chip 20 and the leads 30. The shape and packaging way of the resin base 10 are also not restricted.

Figure 1:
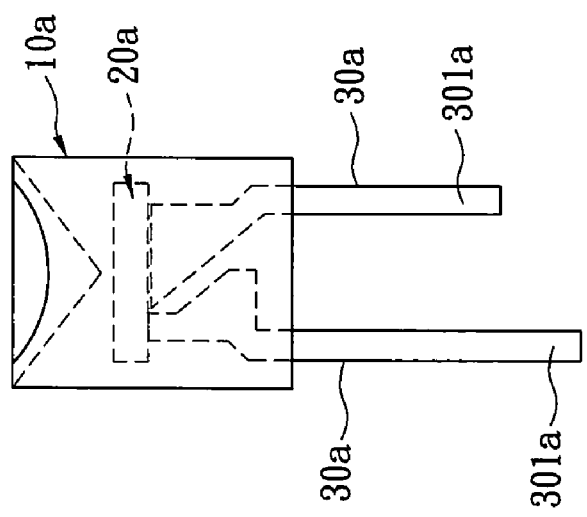
FIG. 1 is a schematic drawing showing structure of a LED element available now.

Refer to FIG. 2, the LED element 1 of the present invention features on that: the lead 30 is a two-part lead formed by an upper part 31 and a lower part 32. The upper part 31 has the structure similar to that of the LED element in FIG. 1 available now, made from iron sheet by stamping. The length of the upper part 31 is not limited. Generally, the length of the upper part 31 is shorter than the length of the lead of the LED element available now. A top end 311 of the upper part 31 is embedded in the resin base 10 while a bottom end 312 extends out of the resin base 10. A top end 321 of the lower part 32 is connected with the bottom end 312 of the upper part 31 into one part in a fixed way such as welding or crimping. Moreover, the lower part 32 is made of conductive metal that is softer than the metal of the upper part 31 such as copper, aluminum, other metals or their alloys with good electrical and thermal conductivity. The shape of the lower part 32 is not limited, depending on user's needs. It can be a metal sheet, a metal wire or a metal strand formed by a plurality of thin metal wires. Compare with the upper part 31 or the lead of the LED element available now, the lower part 32 has features of rust resistance, and easily bending due to better toughness. Thus while assembling the LED element 1 of the present invention, a LED element 1 is installed on a circuit board or an electronic by its lead 30 for setting an electrical connection. The lower part 32 is easily to perform secondary processing such as bending processing. Furthermore, the lower part 32 can withstand repeated bending without breaking and it does not rust or corrode easily. Thus the LED element 1 of the present invention is with features of higher strength, precise alignment, and good electrical conductivity during the assembling processes, compared with the LED element available now. The lights or other applications of the LED element 1 of the present invention will not get damage easily and the life span is further improved.

Figure 3:
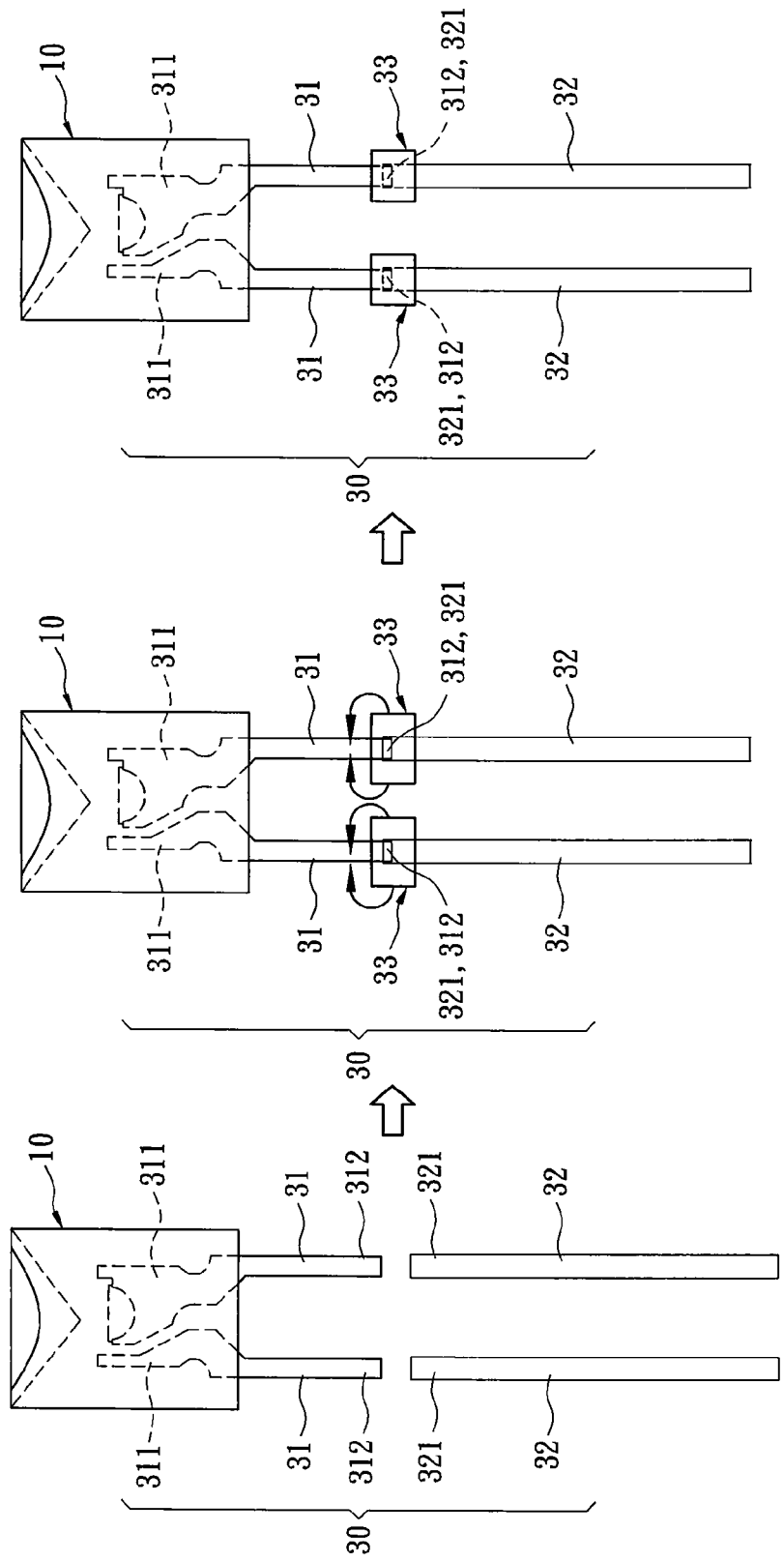
FIG. 3A to FIG. 3C show an embodiment of a processing flow chart for connecting an upper part and a lower part of a lead of a LED element by crimping according to the present invention.

The feasible connection ways between the lower part 32 the and upper part 31 are described in followings. The top end 321 of the lower part 32 is directly welded on the bottom end 312 of the upper part 31. Beside welding (not shown in figure), the following crimping way can also be used. Refer to FIG. 3A-3C, arrange a lower part 32 corresponding to and overlapping with each upper part 31, as shown in FIG. 3A and FIG. 3B. Then a metal terminal 33 that is a metal sheet formed by iron, copper, aluminum, other metals with good electrical conductivity and thermal conductivity or their alloys is set on the overlapping area between the upper part 31 and the lower part, as shown in FIG. 3B. By crimping, the bottom end 312 of the upper part 31 and the top end 321 of the lower part 32 are enclosed and assembled by the metal terminal 33 to form an integrated part, as shown in FIG. 3C.

Figure 4:
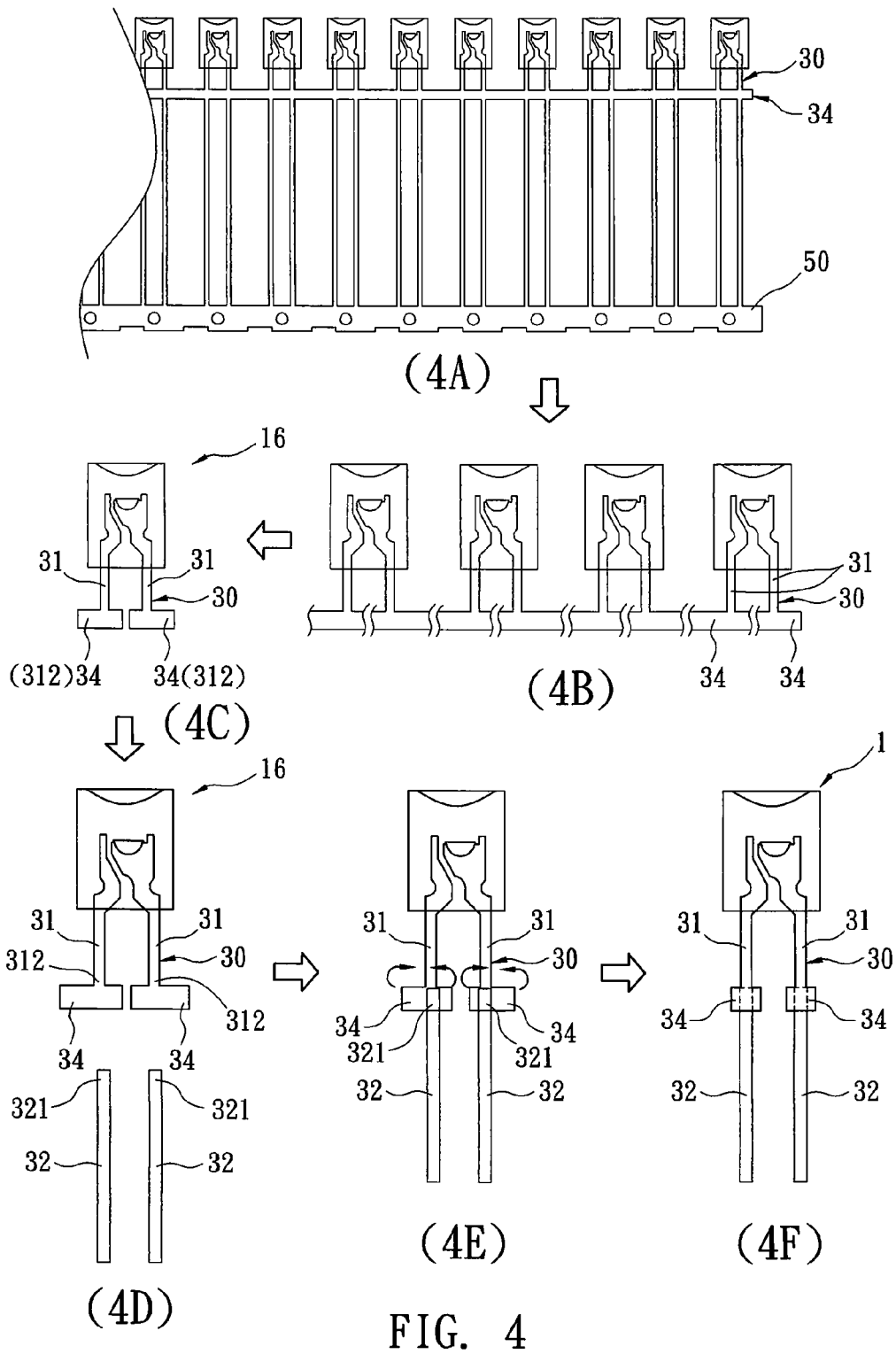
FIG. 4A to FIG. 4F show another embodiment of a processing flow chart for manufacturing leads of a LED element by crimping according to the present invention.

Refer from FIG. 4A to FIG. 4F, the upper part 31 of the lead 30 is connected with the lower part 32 by the forming shape of the bottom end 312 thereof in an enclosed way. The upper part 31 of the lead 30 is made of a metal sheet 50 such as an iron sheet by stamping during automatic manufacturing processes that are similar to manufacturing processes of leads of LED elements available now. And a strip formed by a plurality of butt ends 34 is located under the upper part 31, as shown in FIG. 4A and FIG. 4B. Then the strip with leads are cut into a plurality of semi-manufactured products 16 of the LED element, as shown in FIG. 4C and FIG. 4D. After cutting, a butt end 34 extends from the bottom end 312 of the upper part 31 on the left side and the right side of the semi-manufactured product 16. Then each butt end 34 is bent by a preset fixture. At the same time the butt end 34 also encloses the top end 321 of the lower part 32 to form an integrated part, as shown in FIG. 4D-4F. A LED element 1 is produced. Thereby according to the lead 30 of the present invention, the manufacturing processes are simplified and the production time is reduced so that the manufacturing cost is down.

Figure 6:
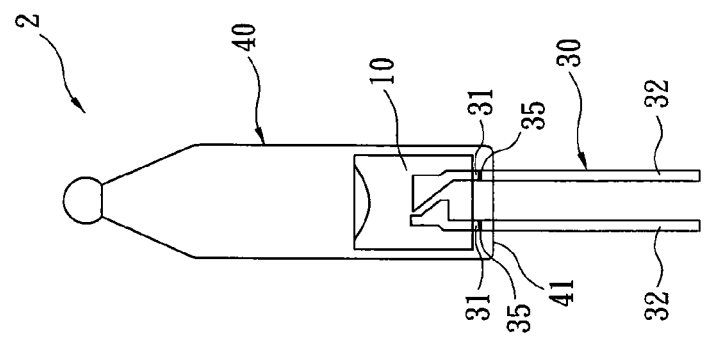
FIG. 6 is another embodiment of a LED light according to the present invention.
Figure 5:
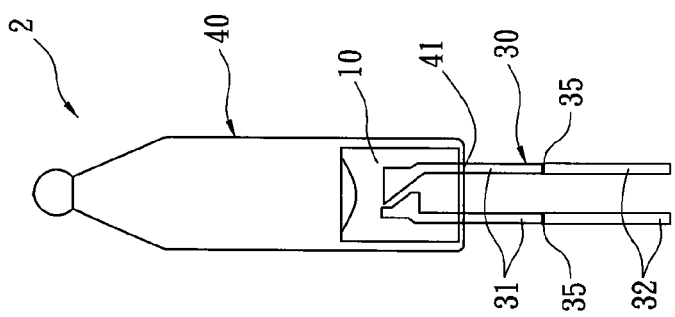
FIG. 5 is an embodiment of a LED light according to the present invention.

Refer to FIG. 5 and FIG. 6, a LED light 2 of the present invention is composed of a LED element 1 and a light housing 40. The LED light 2 can be seen as an embodiment of the LED element 1. As show in figure, the LED element 1 is applied to Christmas lights. The housing is covered over the resin base 10 of the LED element 1. During manufacturing processes, there are a plurality of assembly ways between the LED element 1 and the light housing 40. The light housing 40 is integrated with the LED element 1 by encapsulation or heat sealing.

Figure 7:
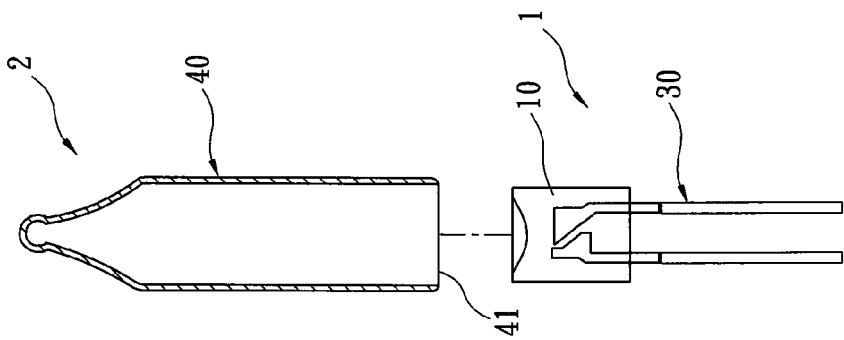
FIG. 7 is an explosive view of an embodiment of a LED light according to the present invention.
Figure 10:
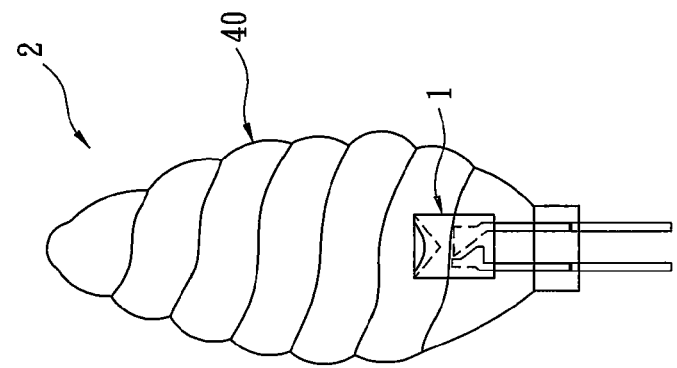
FIG. 10 is an embodiment of a LED light with an ice-cream-shaped housing according to the present invention.
Figure 9:
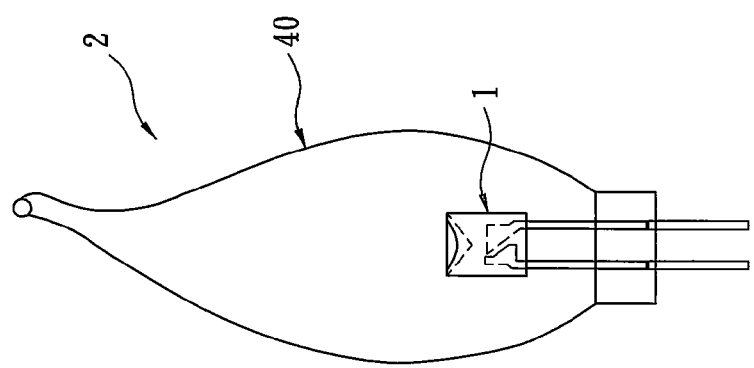
FIG. 9 is an embodiment of a LED light with a flame tip housing according to the present invention.
Figure 8:
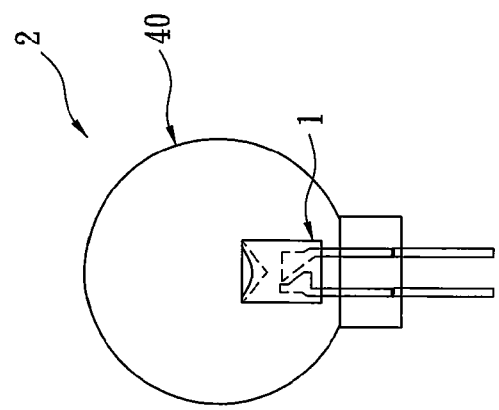
FIG. 8 is an embodiment of a LED light with a ball-shaped housing according to the present invention.

Refer to FIG. 7, an opening 41 is arranged at a bottom of the light housing 40. The resin base 10 of the LED element 1 or part of the lead 30 is mounted into the light housing 40 through the opening 41. The material of the light housing 40 is not limited. It can be transparent or semi-transparent glass or plastic. The shape of the light housing 40 is also not restricted. The shape can be similar to general Christmas lights, as shown in FIG. 5, FIG. 6 and FIG. 7, a ball in FIG. 8, a flame tip in FIG. 9 or an ice cream in FIG. 10.

In addition, in the LED light 2, a connection point 35 between the upper part 31 and the lower part 32 of the lead 30 can be exposed out of the opening 41 on the bottom of the light housing 40, as shown in FIG. 5. The upper part 31 outside the light housing 40 is coated with an anti-rust layer for rust protection. Or the connection point 35 can be mounted into the opening 41 on the bottom of the light housing 40, as shown in FIG. 6.

Thus the lead 30 of the LED element 1 as well as of the LED light 2 according to the present invention has two-part structure for increasing rust protection and toughness thereof. Thus the shortcomings of the lead of the LED element available now such as the tendency to rust, and breakage due to bending can be avoided. This is beneficial to assembly processes and outdoor applications. Moreover, the precise alignment and the electrical connection are ensured. The applications are more diverse and useful. Furthermore, targets of environmental protection and energy savings are attained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light emitting diode element (LED) comprising:
at least one LED chip, a resin base disposed around the LED chip, and at least two leads and each lead having an upper part and a lower part, wherein a top end of the upper part is mounted in the resin base and is electrically connected with the LED chip while a bottom end of the upper end extends out of the resin base and connects with a top end of the lower part; the lower part is made of soft metal so that the lower part is with better toughness than the upper part and this is beneficial to following processing or applications of the LED element, the soft metal being copper, aluminum, copper alloys, or aluminum alloys.

2. The device as claimed in claim 1, wherein the upper part is made of iron by stamping.

3. The device as claimed in claim 1, wherein the bottom end of the upper part and the top end of the lower part are connected by welding.

4. The device as claimed in claim 1, wherein at least one butt end extends from the bottom end of the upper part and the butt end enclosed the top end of the lower part so as to connect the top end of the lower part with the bottom end of the upper part.

5. The device as claimed in claim 1, wherein the lead further includes a metal terminal for connecting the bottom end of the upper part with the top end of the lower part.

6. The device as claimed in claim 1, wherein the lower part is a metal sheet, a metal wire or a metal strand.

* * * * *